United States Patent
Nakatsu et al.

(10) Patent No.: US 6,265,732 B1
(45) Date of Patent: Jul. 24, 2001

(54) LIGHT EMITTING DIODE

(75) Inventors: Hiroshi Nakatsu; Tetsuroh Murakami, both of Tenri; Hiroyuki Hosoba, Kyoto; Takahisa Kurahashi, Kashiba, all of (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/452,057

(22) Filed: Nov. 30, 1999

(30) Foreign Application Priority Data

| Nov. 30, 1998 | (JP) | 10-338655 |
| Nov. 30, 1998 | (JP) | 10-338656 |
| Nov. 26, 1999 | (JP) | 11-336798 |

(51) Int. Cl.[7] .......................... H01L 27/15; H01L 31/12; H01L 33/00
(52) U.S. Cl. ................ 257/86; 257/87; 257/103
(58) Field of Search ................ 257/86, 87, 103

(56) References Cited

U.S. PATENT DOCUMENTS

| 5,329,135 | * | 7/1994 | Terakado . |
| 5,442,201 | * | 8/1995 | Adomi et al. . |
| 5,488,235 | * | 1/1996 | Nozaki et al. . |
| 5,717,226 | * | 2/1998 | Lee et al. . |
| 5,732,098 | | 3/1998 | Nisitani et al. . |
| 5,808,324 | | 9/1998 | Yamada et al. . |
| 6,107,648 | * | 8/2000 | Shakuda et al. . |
| 6,121,691 | * | 10/2000 | Fukunaga et al. . |

FOREIGN PATENT DOCUMENTS

| 0 886 326 A2 | 12/1998 | (EP) . |
| 59-208888 A2 | 11/1984 | (JP) . |
| 2-151085 | 6/1990 | (JP) . |
| 212479 | * 4/1992 | (JP) . |
| 7-288338 | 10/1995 | (JP) . |
| 8-18102 | 1/1996 | (JP) . |
| 2795195 | 6/1998 | (JP) . |
| 10-284756 A2 | 10/1998 | (JP) . |

OTHER PUBLICATIONS

Wang, Li et al. (1996). "Time–Resolved Carrier Recombination Dynamics of 1.3–1.8 μm Broadband Light Emitting Diode Structures," *J. Appl. Phys.* 80(12):6965–6971.

* cited by examiner

Primary Examiner—Stephen D. Meier
(74) Attorney, Agent, or Firm—Morrison & Foerster LLP

(57) ABSTRACT

A light emitting diode includes a substrate, a light emitting layer, a first cladding layer having a first conductivity type and an energy gap greater than an energy gap of the light emitting layer, a second cladding layer having a second conductivity type and an energy gap greater than an energy gap of the light emitting layer, and an intermediate barrier layer having the same conductivity type as the conductivity type of the light emitting layer but different from the conductivity type of the first or second cladding layer, and having an energy gap less than the energy gap of the first or second cladding layer but greater than the energy gap of the light emitting layer. The light emitting diode has a double heterostructure such that the light emitting layer is interposed between the first and second cladding layer. The intermediate barrier layer is disposed between the light emitting layer and the first cladding layer and/or between the light emitting layer and the second cladding layer.

7 Claims, 13 Drawing Sheets

LIGHT EMITTING DIODE

BACKGROUND OF THE INVENTION

1. Field of the Invention

The present invention relates to a light emitting diode (hereinafter referred to as an "LED") having a double heterojunction structure. More particularly, the present invention relates to a technique for preventing a reduction in a light output of an LED for long-time operation.

2. Description of the Related Art

An LED having a so-called double heterostructure has a high level of light emission efficiency and a high light output and therefore is widely used for a display, a light source of optical communications, or the like.

FIG. 12 is a cross-sectional view illustrating a conventional LED 800 having a typical double heterostructure. The LED 800 is an InGaAlP based LED which includes layers having lattice match with a GaAs substrate and emits light ranging from red light to green light. In the LED 800, a substrate 1: made of n-type GaAs;

a first buffer layer 2: made of n-type GaAs;

a light reflection (DBR:Distributed Bragg Reflector) layer 3: including n-type $(Al_{0.4}Ga_{0.6})_{0.5}In_{0.5}P$ layers and n-type $Al_{0.5}In_{0.5}P$ layers deposited in an alternative fashion;

a first cladding layer 4: made of n-type $Al_{0.5}In_{0.5}P$, doped with Si at an impurity concentration of $5 \times 10^{17}$ cm$^{-3}$, 1 $\mu$m thick;

a light emitting layer 6: made of p-type $(Ga_{0.7}Al_{0.9})_{0.5}In_{0.5}P$, 0.5 $\mu$m thick;

a second cladding layer 7: made of p-type $Al_{0.5}In_{0.5}P$, doped with Zn at an impurity concentration of $5 \times 10^{17}$ cm$^{-3}$, 1 $\mu$m thick;

a first current diffusion layer 91: made of p-type $Al_{0.7}Ga_{0.3}Al$, doped with Zn at an impurity concentration of $1 \times 10^{18}$ cm$^{-3}$, 1 $\mu$m thick; and a second current diffusion layer 92: made of p-type $Al_{0.7}Ga_{0.3}As$, doped with Zn at an impurity concentration of $3 \times 10^{18}$ cm$^{-3}$, 6 $\mu$m thick;

are deposited in this order.

The first and second current diffusion layers 91 and 92 constitute a current diffusion layer 9.

A film of AuGe is provided as an n-side electrode 11 on a lower surface of the substrate 1 by a typical deposition method. A film of AuZn is provided on a upper surface of the p-type current diffusion layer 9 by the same deposition method. The AuZn film is subjected to photolithography patterning so as to remain a circular portion thereof as a p-side electrode 10 to which a metal wire is bonded for connecting the p-side electrode 10 to an external conductor. Light generated in the light emitting layer 6 is radiated from a portion of the upper surface of the p-type current diffusion layer 9 from which the AuZn film has been removed.

The first buffer layer 2 is used for preventing defects and contaminants of the substrate 1 from effecting the layers deposited the substrate 1. The first buffer layer 2 is not required when the substrate 1 has a satisfactorily treated upper surface. The DBR layer 3 reflects light generated in the light emitting layer 6 toward the substrate 1. This prevents light absorption by the substrate 1 and the reflected light goes in a direction away from the substrate 1, contributing to the brightness of the LED 800.

The current diffusion layer 9 has low resistivity so as to make an approximate ohmic contact with the p-side electrode 10 and also to diffuse a current injected from the p-side electrode 10 into the entire light emitting layer 6. This is why the current diffusion layer 9 requires a high level of impurity concentration, in this case, to prevent impurity Zn from diffusing into the light emitting layer 6, the first current diffusion layer 91 having a low impurity concentration is provided in the lower part of the current diffusion layer 9.

To obtain a high level of light emission efficiency, a conventional LED adopts a double heterostructure as shown in FIG. 15. FIG. 15 is a cross-sectional view illustrating an example of an AlGaInP based LED 900 which have lattice match with GaAs substrate 101. A structure of each layer in the LED 900 is as follows:

a substrate 101: made of n-type GaAs;

a buffer layer 102: made of n-type GaAs;

an n-type first cladding layer 103: made of n-type $(Ga_{0.3}Al_{0.7})_{0.5}In_{0.5}P$, doped with Si at an impurity concentration of $1 \times 10^{18}$ cm$^{-3}$, 1 $\mu$m thick;

a light emitting layer 104: made of p-type $(Ga_{0.7}Al_{0.3})_{0.5}In_{0.5}P$, 0.5 $\mu$m thick;

a p-type second cladding layer 105: made of p-type $Al_{0.5}In_{0.5}P$, doped with Zn at an impurity concentration of $5 \times 10^{17}$ cm$^{-3}$, 1 $\mu$m thick;

a first current diffusion layer 61: made of p-type $Ga_{0.3}Al_{0.7}Al$, doped with Zn at an impurity concentration of $1 \times 10^{18}$ cm$^{-3}$, 1 $\mu$m thick;

a second current diffusion layer 62: made of p-type $Ga_{0.3}Al_{0.7}As$, doped with Zn at an impurity concentration of $3 \times 10^{18}$ cm$^{-3}$, 6 $\mu$m thick; and a contact layer 108: made of p-type GaAs.

An n-side electrode 109 and a p-side electrode 107 are provided on the substrate 1 and the contact layer 108, respectively.

The AlGaInP based LED 800 in FIG. 12 generates light by injecting a current. In FIG. 13, a dashed line A indicates a relationship between an impurity concentration of the light emitting layer 6 and a light output in an initial period after starting light emission. The peak of the light output is at an impurity concentration of $1 \times 10^{17}$ cm$^{-3}$ in the initial period after starting light emission. However, the light output gradually decreases with time. For example, a current of 50 mA is supplied to the LED 800 for 1000 hours at room temperature. In FIG. 13, a dashed line B indicates a relationship between an impurity concentration of the light emitting layer 6 and a light output after the 1000-hour light emission. A light output after the 1000-hour light emission becomes lower at an impurity concentration of $1 \times 10^{17}$ cm$^{-3}$ while a light output becomes higher at an impurity concentration of $5 \times 10^{17}$ cm$^{-3}$ where the light output is maximum, which is different from in the initial period after starting light emission.

Our studies have found that such a change in a light output after long-time light emission is caused by: (1) a non-radiative recombination center generated at a pn junction interface between the n-type first cladding layer 4 and the p-type light emitting layer 6; and (2) an influence from diffused impurities in the light emitting layer 6.

FIGS. 14A and 14B illustrate states of energy bands of around the light emitting layer 6. FIG. 14A shows a state in the initial period after starting light emission, while FIG. 14B shows a state after the long-time light emission.

The pn junction interface 40 is a heterointerface where two layers having largely different energy gaps As shown in FIG. 14A make contact with each other. There is a large internal stress at the heterointerface 40. When a voltage is applied between the p-side electrode 10 and the n-side electrode 11 in order to generate light, a high electric field level is applied across the heterointerface 40.

The combination of the internal stress and the energy of light generated in the light emitting layer 6 causes a lattice defect at the heterointerface 40. This lattice defect grows along the direction of the electric field line into the light emitting layer 6 over the long-time light emission. The lattice defeat leads to formation of a deep energy level 20 in the vicinity of the heterointerface 40 as shown in FIG. 14B. The carriers, a hole and an electron, combine together at the deep energy level without emitting light. Such a deep energy level is called a non-radiative energy level. Since radiative recombination 30 of the LED 800 is a spontaneous emission process, the non-radiative recombination 31 at the non-radiative energy level 20 has a shorter lifetime than that of the radiative recombination 30. Therefore, when the number of carriers combining at the non-radiative energy level 20 is increased, the light emission efficiency of the LED 800 decreases.

Long-time light emission continues to cause the growth of the lattice defect which becomes widespread inside the light emitting layer 6. In other words, the light emitting layer 6 develops a lot of portions having the non-radiative energy level 20. Therefore, the light emission efficiency of the LED 800 is further decreased, i.e., the light output of the LED 800 is reduced compared with in the initial period of the light emission.

Japanese Laid-Open Publication No. 2-151085 discloses a semiconductor light emitting device (hereinafter referred to as a "LED of conventional Example 2") having structure similar to that shown in FIG. 12. The LED of conventional Example 2 includes an intermediate cladding layers interposed between the light emitting layer 6 and the first and second cladding layers 4 and 7. The intermediate cladding layers each have a thickness of more than about 10 Å and less than about 200 Å, and an energy gap having a value between those of the light emitting layer 6 and the first and second cladding layers 4 and 7. In the LED of conventional Example 2, heterointerfaces are formed between the intermediate cladding layer and the first and second cladding layers 4 and 7, and between the intermediate cladding layer and the light emitting layer 6. Accordingly, the differences in an energy gap at the interfaces can be decreased, thereby reducing the internal stress. This, therefore, creates difficulty for a lattice defect to be generated and thus there are less non-radiative recombination centers in the light emitting layer 6.

In the LED of conventional Example 2, however, a pn junction is formed at the interface between the light emitting layer 6 and the intermediate layer. A lattice defect due to light emission is generated at the interface where a high electric field level exists. Although a decrease in a light output of the LED of conventional Example 2 is effectively delayed, long-time light emission allows a lattice defect generated at the interface to develop. The growth of the lattice defect decreases a light output of the light emitting layer 6.

As described in FIG. 13, after the long-time light emission, the light emitting layer having a higher concentration of impurity will have a higher light output. This phenomenon will now be described. When the light emitting layer 6 has a higher concentration of impurity than an optimal concentration, the resistivity of the light emitting layer 6 becomes low. Therefore, an electric field applied across the pn junction interface between the first cladding layer 4 and the light emitting layer 6 becomes small in extent, resulting in a low light output in an initial period after starting light emission. After long-time light emission, extra impurities are diffused in the light emitting layer 6 because of the electric field and heat generated in the vicinity of the light emitting layer 6. The diffusion of impurities increases the electric field and therefore the light output. In this case, a defect is also generated at the pn junction interface, and therefore, the light emission efficiency decreases after the long-time light emission.

In the LED 900 shown in FIG. 15, the buffer layer 102 is used to shield the influence of defects and contaminants of the substrate 101. The buffer layer 102 is not necessary when surface treatment of the substrate 101 is satisfactory. The contact layer 108 is made of GaAs, which does not contain Al, in order to facilitate ohmic contact with the p-side electrode 107. The contact layer 108 does not allow light generated by the light emitting layer 104 to pass therethrough. However, the contact layer 108 is provided directly under the electrode 107, adding no disadvantage to light radiation.

In the LED 900 shown in FIG. 15, energy gaps of the light emitting layer 104 and the first and second cladding layers 103 and 105 are set by a molar fraction of Al. The lattice constant of a III–V compound semiconductor is almost not variable when Al is replaced with Ga or vice versa. The greater the molar fraction of Al that is included, the greater the energy gap of the compound semiconductor. Hereinafter, the proportion of Al in the total amount of Al and Ga in a mixed crystal is regarded as a molar fraction of Al in the mixed crystal.

To obtain a high light output of the LED 900, it is required to satisfactorily confine carriers within the light emitting layer 104 by making differences between the energy gaps of the light emitting layer 104 and the first and second cladding layers 103 and 105 sufficiently great. The LED 900 has a double heterostructure in which the $(Ga_{0.7}Al_{0.3})_{0.5}In_{0.5}P$ light emitting layer 104 is interposed between the n-type $(Ga_{0.3}Al_{0.7})_{0.5}In_{0.5}P$ first cladding layer 103 and the p-type $(Ga_{0.3}Al_{0.7})_{0.5}In_{0.5}P$ second cladding layer 105 which have great energy gaps. A molar fraction of Al of the light emitting layer 104 is 0.3 while both of molar fractions of Al of the first and second cladding layers 103 and 105 are 0.7.

To obtain a high light output of the LED 900, diffusion of carriers injected from the electrode 107 into the entire light emitting layer 104 is required. To this end, a decrease in the resistivity of the current diffusion layer 106 by increasing an impurity concentration of the current diffusion layer 106 to a sufficient high level is required. The substrate 101 is typically made of an n-type semiconductor, so that a p-type semiconductor is used for the current diffusion layer 106. However, an impurity for a p-type semiconductor, such as Zn or Mg, is likely to diffuse. An interface between the layers having impurity concentrations largely different from each other has a high impurity concentration gradient. Therefore, in the interface, the impurity is likely to diffuse due to interaction of electrical energy with light energy generated by the light emitting layer 104.

For example, the current diffusion layer 106 and p-type second cladding layer 105, as well as the p-type second cladding layer 105 and light emitting layer 104, have the above-described relationship therebetween. Therefore, impurity diffusion is likely to take place between the current diffusion layer 106 and p-type second cladding layer 105 and between the p-type second cladding layer 105 and light emitting layer 104.

Even when the light emitting layer 104 initially has an optimal concentration of a p-type impurity, the concentration changes due to diffusion of the impurity and therefore the light emission efficiency of the light emitting layer 104 is decreased. Further, the p-type impurity entering the light emitting layer 104 by diffusion is unlikely to settle into a normal position of lattice, becoming a non-radiative recombination center which has a deep energy level.

In the conventional LED 900 shown in FIG. 15, the current diffusion layer 106 includes two layers. The lower layer is a first current diffusion layer 61 having a low impurity concentration. Therefore, the impurity concentration gradient between the light emitting layer 104 and the first current diffusion layer 61 becomes a low value, whereby diffusion of Zn is prevented. The first current diffusion layer 61 and the second current diffusion layer 62 has the same molar fraction of Al.

Conventionally, molar fractions of Al of the first and second cladding layers 103 and 105 are about 0.7. The inventors have found that the above-described conventional technique is insufficient to prevent impurity diffusion when the molar fractions of Al of the first and second cladding layers 103 and 105 are increased up to about 1.0 in order to enhance carrier confinement and obtain a higher light output of the LED 900. In other words, the above-described p-type impurity diffusion is significant when a molar fraction of Al is great.

SUMMARY OF THE INVENTION

A light emitting diode according to the present invention includes a substrate; a light emitting layer: a first cladding layer having a first conductivity type and an energy gap greater than an energy gap of the light emitting layer; a second cladding layer having a second conductivity type and an energy gap greater than an energy gap of the light emitting layer; and an intermediate barrier layer having the same conductivity type an the conductivity type of the light emitting layer but different from the conductivity type of the first or second cladding layer, and having an energy gap less than the energy gap of the first or second cladding layer but greater than the energy gap of the light emitting layer. The light emitting diode has a double heterostructure such that the light emitting layer is interposed between the first and second cladding layer. The intermediate barrier layer is disposed between the light emitting layer and the first cladding layer and/or between the light emitting layer and the second cladding layer.

Therefore, a crystal defect generated at a pn junction is prevented from affecting a light emitting layer, thereby realizing the LED in which a reduction in a light output is prevented even after long-time light emission.

In one embodiment of the present invention, a thickness of the intermediate barrier layer is less than a diffusion length of a minority carrier in the intermediate barrier layer and is greater than a value such that a non-radiative recombination center generated at an interface between the intermediate barrier layer and the first or second cladding layer has substantially no influence on the light emitting layer.

In one embodiment of the present invention, a thickness of the intermediate barrier layer is in the range of 0.1 $\mu$m or more and 0.5 $\mu$m or less.

Therefore, a crystal defect generated at a pn junction is prevented from affecting a light emitting layer so that a reduction in light emission efficiency is prevented, thereby realizing the LED in which a reduction in a light output is prevented even after long-time light emission.

In one embodiment of the present invention, the energy gap of the intermediate barrier layer is greater by 0.2 eV or more than the energy gap of the light emitting layer.

Therefore, non-radiative recombination in the intermediate barrier layer is further decreased, thereby realizing the LED having a high level of light emission efficiency.

In one embodiment of the present invention, the intermediate barrier layer is an indirect transition type semiconductor layer having a long non-radiative recombination lifetime.

Therefore, non-radiative recombination in the intermediate barrier layer is substantially eliminated, thereby realizing the LED having a high level of light emission efficiency.

In one embodiment of the present invention, the intermediate barrier layer includes first and second intermediate barrier layers. The first intermediate barrier layer is provided between the light emitting layer and the first cladding layer. The second intermediate barrier layer is provided between the light emitting layer and the second cladding layer. The first intermediate barrier layer having the same conductivity type as the conductivity type of the light emitting layer but different from the conductivity type of the first cladding layer adjacent to the first intermediate barrier layer, and having an energy gap less than the energy gap of the first cladding layer but greater than an energy gap of the light emitting layer. The second intermediate barrier layer having the same conductivity type as the conductivity type of the light emitting layer and the conductivity type of the second cladding layer adjacent to the second intermediate barrier layer, and having an energy gap less than the energy gap of the second cladding layer but greater than the energy gap of the light emitting layer.

Therefore, a crystal defect generated at a pn junction is prevented from affecting a light emitting layer so that a reduction in light emission efficiency is prevented. Further, a p-type impurity which tends to be easily diffused is prevented from diffusing into the light emitting layer, thereby preventing a reduction in light emission efficiency.

In one embodiment of the present invention, the substrate is made of GaAs the first cladding layer is made of $(Ga_{1-x2}Al_{x2})_{0.5}In_{0.5}P$ (x1<x2$\leq$1); the light emitting layer is made of a $(Ga_{1-x1}Al_{x1})_{0.5}In_{0.5}P$ (0$\leq$x1<1); the intermediate barrier layer is made of $(Ga_{1-x4}Al_{x4})_{0.5}In_{0.5}P$ (x1<x4<x2, x3); and the second cladding layer is made of $(Ga_{1-x3}Al_{x3})_{0.5}In_{0.5}P$ (x1<x3$\leq$1).

Therefore, a light output is less decreased in a spectrum from red light to green light even after long-time light emission.

According to another aspect of the invention, a light emitting diode includes a substrate; a light emitting layer; a p-type cladding layer having an energy gap greater than an energy gap of the light emitting layer; and an n-type cladding layer having an energy gap greater than the energy gap of the light emitting layer. The light emitting diode is made of at least III–V compound semiconductor material and has a double heterostructure such that the light emitting layer is interposed between the p-type and n-type cladding layer. The p-type cladding layer includes a p-type second intermediate barrier layer and a p-type second cladding layer. The p-type second intermediate barrier layer is nearer the light emitting layer than the p-type second cladding layer is. The p-type second intermediate barrier layer has a lower molar fraction of Al and A lower impurity concentration than a molar fractino of Al and an impurity concentration of the p-type second cladding layer, respectively.

Therefore, even when the LED is a high-intensity LED which includes a cladding layer having a high molar fraction of Al, a p-type impurity which tends to be easily diffused is prevented from diffusing from the current diffusion layer or the p-type second cladding layer into the light emitting layer even after long-time light emission, thereby preventing a reduction in light emission efficiency.

In one embodiment of the present invention, a molar fraction of Al of the p-type second intermediate barrier layer is 0.5 or less, and a molar fraction of Al of the p-type second cladding layer is 0.7 or more.

Therefore, the crystallinity of the p-type second intermediate barrier layer is satisfactorily maintained, thereby making it possible to prevent diffusion of an impurity.

In one embodiment of the present invention, an impurity concentration of the p-type second intermediate barrier layer is $3 \times 10^{17}$ cm$^{-3}$ or less. A thickness of the p-type second intermediate barrier layer is in the range of 0.1 µm or more and 0.5 µm or less.

Therefore, even when the LED includes the p-type second intermediate barrier layer, the p-type second cladding layer maintains a carrier confinement effect, thereby realizing a high light output and making it possible to maintain a characteristic of the LED at high temperature. Further, the p-type second cladding layer has a low impurity concentration and therefore absorbs incoming impurities to prevent them from diffusing into the light emitting layer.

In one embodiment of the present invention, the substrate is made of GaAs; the n-type first cladding layer is made of $(Ga_{1-x2}Al_{x2})_{0.5}In_{0.5}P$ (x1<x2≦1); the light emitting layer is made of $(Ga_{1-x1}Al_{x1})_{0.5}In_{0.5}P$ (0≦x1<x2, x3); the p-type second intermediate barrier layer is made of $(Ga_{1-x4}Al_{x4})_{0.5}In_{0.5}P$ (x1<x4<x3, an impurity concentration of less than $5 \times 10^{17}$ cm$^{-3}$); and the p-type second cladding layer is made of $(Ga_{1-x3}Al_{x3})_{0.5}In_{0.5}P$ (x1<x3≦1, an impurity concentration of $5 \times 10^{17}$ cm$^{-3}$ or more).

Therefore, even when the LED emits light in a spectrum from red light to green light at high intensity for a long time, a p-type impurity which tends to be easily diffused is prevented from diffusing from the current diffusion layer or the p-type second cladding layer into the light emitting layer, thereby preventing a reduction in a light output.

Thus, the invention described herein makes possible the advantages of (1) providing an intermediate barrier layer to prevent a defect generated at a pn junction interface from penetrating into a light emitting layer; (2) satisfactorily confining carriers by increasing a molar fraction of Al in a p-type second cladding layer; and therefore (3) providing an LED with a high level of reliability in which a reduction in a light output is prevented after long-time light emission.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the accompanying drawings.

EXAMPLE 1

Figure 1:
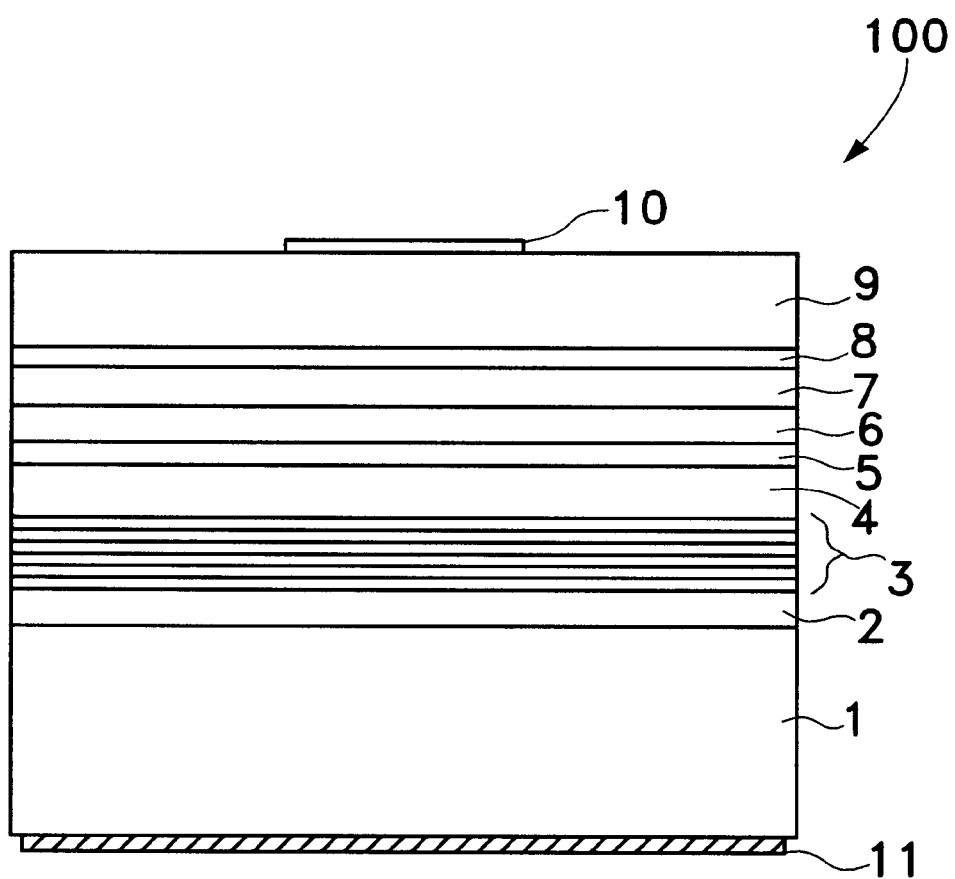
FIG. 1 is a cross-sectional view illustrating an LED according to Example 1 of the present invention.

FIG. 1 is a cross-sectional view illustrating a structure of an LED 100 according to Example 1 of the present invention. For the sake of simplicity, components having the same functions as those of the LED 800 are indicated by the same reference numerals as those used therein. The LED 100 includes:

a substrate 1: made of GaAs;

a first cladding layer 4: made of $(Ga_{1-x2}Al_{x2})_{0.5}In_{0.5}P$ (x1<x2≦1);

a light emitting layer 6: made of $(Ga_{1-x1}Al_{x1})_{0.5}In_{0.5}P$ (0≦x1<1);

an intermediate barrier layer 5: made of $(Ga_{1-x4}Al_{x4})_{0.5}In_{0.5}P$ (x1<x4<x2, x3); and a second cladding layer 7: made of $(Ga_{1-x3}Al_{x3})_{0.5}In_{0.5}P$ (x1<x3≦1).

With this structure, it is possible to obtain an LED such that a light output of the LED is less decreased in a spectrum from red light to green light even after long-time light emission.

More specifically, the LED 100 includes:

a substrate 1: made of n-type GaAs;

a first buffer layer 2: made of n-type GaAs;

a light reflection (DBR) layer 3: including n-type $(Al_{0.4}Ga_{0.6})_{0.5}In_{0.5}P$ layers and n-type $Al_{0.5}In_{0.5}P$ layers deposited in an alternatively fashion;

a first cladding layer 4: made of n-type $Al_{0.5}In_{0.5}P$, doped with Si at an impurity concentration of $5 \times 10^{17}$ cm$^{-3}$, 1 µm thick;

an intermediate barrier layer 5: made of p-type $(Ga_{0.5}Al_{0.5})_{0.5}In_{0.5}P$, doped with Zn at an impurity concentration of $1 \times 10^{17}$ cm$^{-3}$, 0.2 µm thick;

a light emitting layer 6: made of p-type $(Ga_{0.7}Al_{0.3})_{0.5}In_{0.5}P$, doped with Zn at an impurity concentration of $1\times10^{17}$ cm$^{-3}$, 0.5 μm thick;

a second cladding layer 7: made of p-type $Al_{0.5}In_{0.5}P$, doped with Zn at an impurity concentration of $5\times10^{17}$ cm$^{-3}$, 1 μm thick;

a second buffer layer 8: made of p-type $(Al_{0.05}Ga_{0.95})_{0.95}In_{0.05}P$, doped with Zn at an impurity concentration of $1\times10^{18}$ cm$^{-3}$, 0.15 μm thick; and a current diffusion layer 9: made of p-type $(Al_{0.01}Ga_{0.99})_{0.99}In_{0.01}P$, doped with Zn at an impurity concentration of $5\times10^{18}$ cm$^{-3}$, 7 μm thick.

Figure 12:
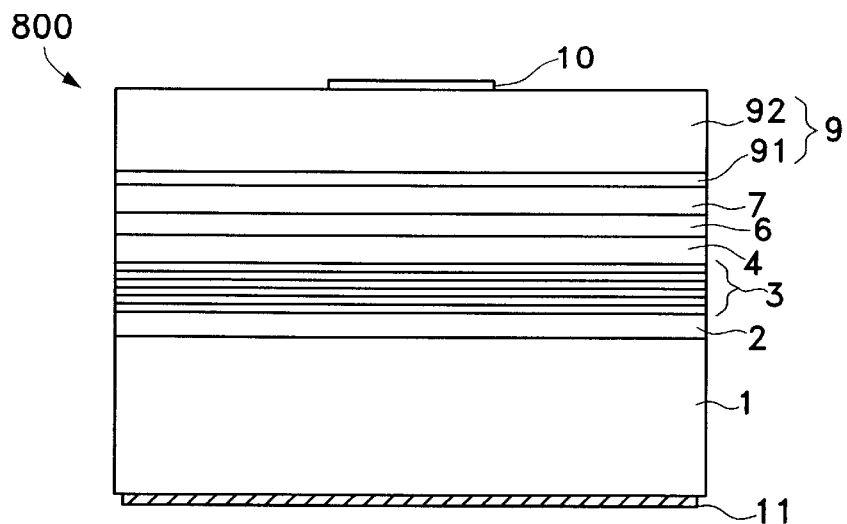
FIG. 12 is a cross-sectional view illustrating a conventional LED.

The LED 100 in this specific example differs from the LED 800 shown in FIG. 12 in that the intermediate barrier layer 5 is provided between the light emitting layer 6 and first cladding layer 4. The intermediate barrier layer 5 has a conductivity type which is the same as that of the light emitting layer 6 but different from that of the first cladding layer 4. The energy gap of the intermediate barrier layer 5 is greater than that of the light emitting layer 6 but less than that of the first cladding layer 4. An impurity concentration of Zn in the p-type light emitting layer 6 is $1\times10^{17}$ cm$^{-3}$, which is the optimal value for light efficiency in an initial period after starting light emission.

Different from the conventional LED 800, in Example 1, the current diffusion layer 9 is made of InGaAlP. This is an attempt to make light absorption as low as possible and light output as great as possible.

However, the current diffusion layer 9 does not have lattice match with the GaAs substrate 1. To decrease the resistivity of the current diffusion layer 9, a molar fraction of Al need to be a low value, i.e., 0.01. Therefore, a molar fraction of In is set to 0.01 to compensate a reduction in a energy gap due to the decreased molar fraction of Al. Since the current diffusion layer 9 contains the 0.01 molar fraction of In, an upper surface thereof is smoother than when made of GaP. Therefore, an electrode 10 formed on the upper surface of the current diffusion layer 9 will be difficult to detach. The low In molar fraction of 0.01 does not allow the current diffusion layer 9 to have lattice match with any of the layers from the substrate 1 to the second cladding layer 7. Accordingly, the second buffer layer 8 is provided between the second cladding layer 7 and the current diffusion layer 9 to prevent generation of crystal defects due to mismatch of lattice constants. Specifically, the second buffer layer 8 has a lattice constant intermediate between that of the current diffusion layer 9 and those of the substrate 1 and so on. The intermediate lattice constant of the second buffer layer 8 is obtained when both of molar fractions of Al and In are 0.05.

Effects of the intermediate barrier layer 5 will be described below with reference to FIG. 2.

Figure 2A:
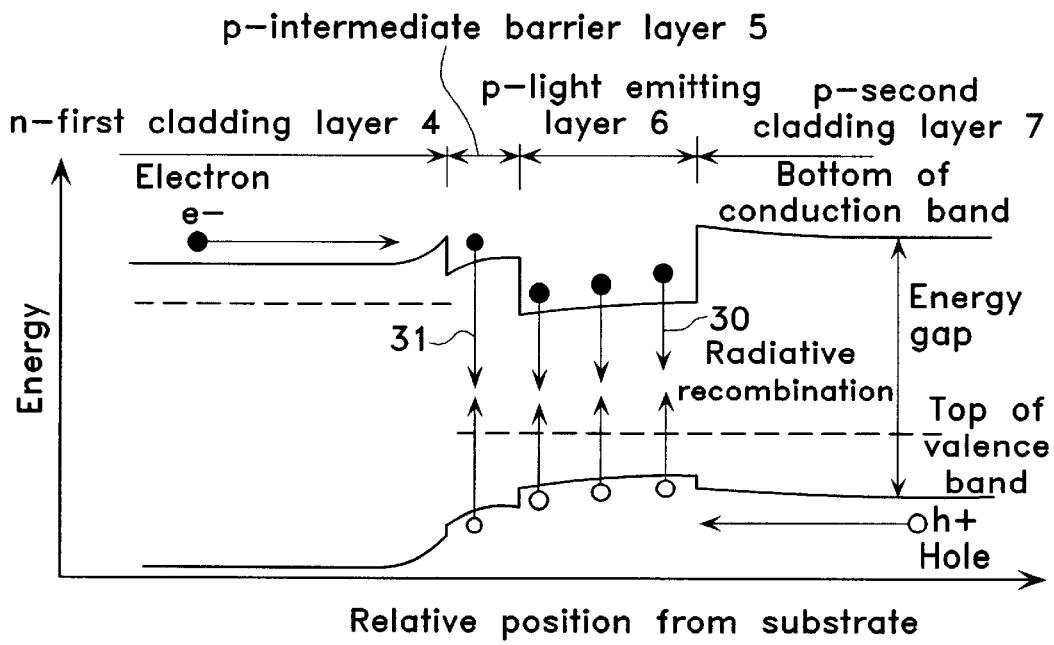
FIGS. 2A and 2B are diagrams illustrating a state of energy bands in the vicinity of a light emitting layer of the LED of Example 1 in an initial period of light emission and after long-time light emission, respectively.
Figure 2B:
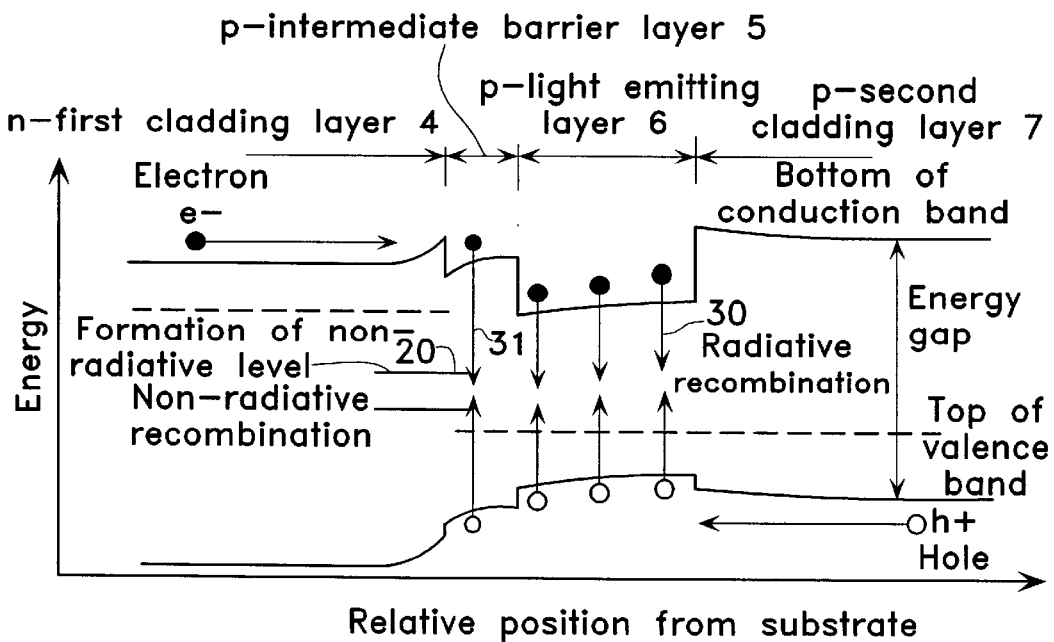
Figure 14A:
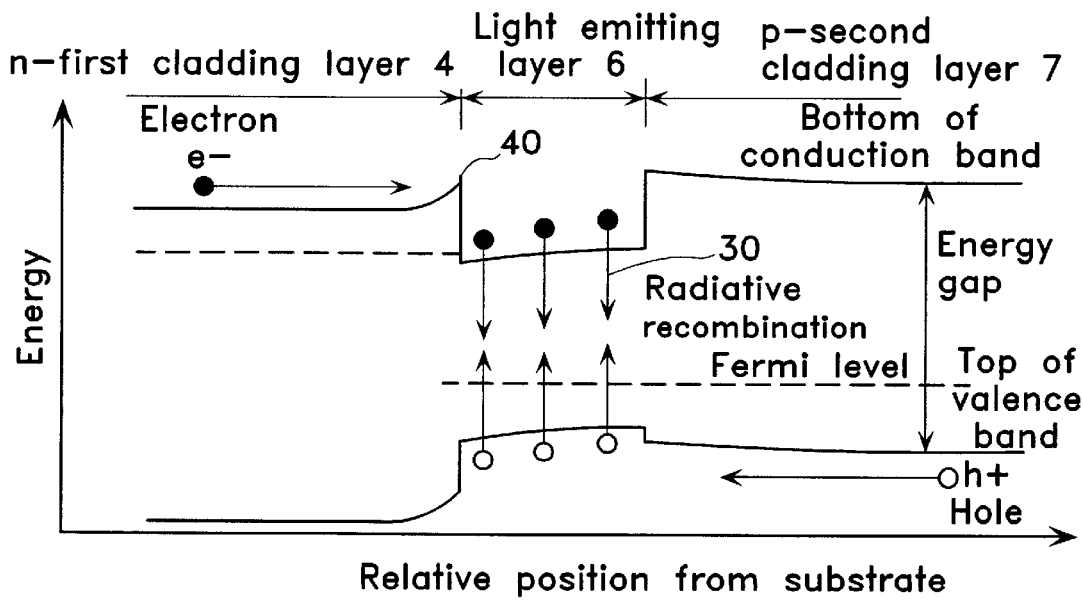
FIGS. 14A and 14B are diagrams illustrating a state of energy bands in the vicinity of a light emitting layer of the conventional LED shown in FIG. 12.
Figure 14B:
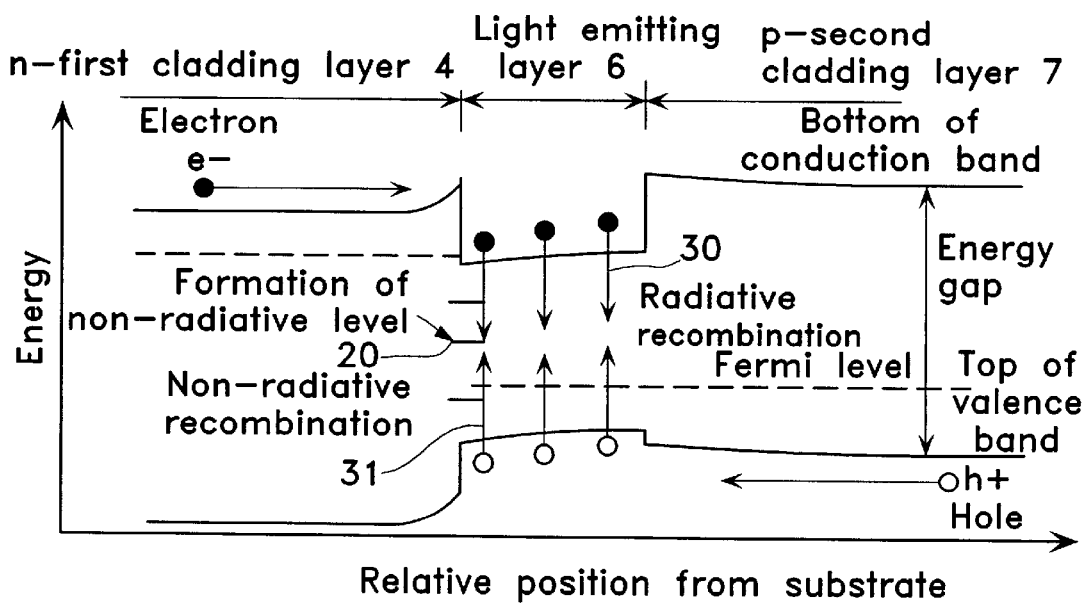

FIGS. 2A and 2B illustrate band states of the LED 100 after long-time light emission. Like FIGS. 14A and 14B, FIG. 2A illustrates a state of the LED 100 when carriers are injected to the light emitting layer 6 with a forward bias. The intermediate barrier layer 5 has a molar fraction of Al, such that an energy gap level thereof is between those of the n-type first cladding layer 4 and p-type light emitting layer 6. Since the intermediate barrier layer 5 is of a p-type, a pn junction is formed between the n-type first cladding layer 4 and the p-type intermediate barrier layer 5. Injected carriers are recombined in the vicinity of the pn junction. Both a hole and a electron exist in the layer which has a lower energy gap, i.e., the intermediate barrier layer 5. Even when a thickness of the intermediate barrier layer 5 is sufficiently less than the diffusion length of the injected minority carrier, a sufficient number of minority carriers are also injected to the light emitting layer 6. Since the radiative recombination lifetime is shorter in the light emitting layer 6 than in the intermediate barrier layer 5, a greater proportion of carriers are consumed in the light emitting layer 6 than in the intermediate barrier layer 5. Thus, the light emitting layer 6 has a lack of carriers and therefore the carriers entering the intermediate barrier layer 5 are quickly transferred to the light emitting layer 6. Although a large number of holes and electrons exist in the intermediate barrier layer 5, radiative recombination efficiently takes place in the light emitting layer 6. This is because the lower energy gap leads to the shorter radiative recombination lifetime.

As described above, the intermediate barrier layer 5 has substantially no influence on light emission and light efficiency of the LED 100.

FIG. 2B illustrates a band state of the LED 100 including the intermediate barrier layer 5 after long-time light emission. An energy level 20 of non-radiative recombination is created in the vicinity of the pn junction. Nevertheless, since carriers in the intermediate barrier layer 5 quickly diffuse into the light emitting layer 6 as described above, the number of carriers which combine at this energy level 20 is small, resulting in prevention of a decrease in light efficiency.

As described above, the intermediate barrier layer 5 has a conductivity type which is the same as that of the light emitting layer 6, but different from that of the first cladding layer 4. The energy gap of the intermediate barrier layer 5 is greater than that of the light emitting layer 6 but less than that of the first cladding layer 4. With the intermediate barrier layer 5, the LED 100 can be realized such that light efficiency of the light emitting layer 6 does not decrease both in an initial period of light emission and after long-time light emission.

A diffusion length of an electron is typically 0.5–1.5 μm. In Example 1, the InGaAlP based semiconductor layers whose molar fractions of In are around 0.5 have a diffusion length of about 0.5 μm. In the LED 100, therefore, a thickness of the intermediate barrier layer 5 is set to 0.2 μm. After long-time light emission, a crystal defect is generated in the vicinity of the interface (pn junction) between the p-type intermediate barrier layer 5 and the n-type first cladding layer 4. To prevent the crystal defect from growing and therefore affecting the light emitting layer 6 in a light emission time of an actual use, a thickness of the p-type intermediate barrier layer 5 is preferably great, i.e., 0.1 μm or more.

In the LED 100, when an energy gap of the p-type intermediate barrier layer 5 is greater by 0.2 eV or more than that of the light emitting layer 6 (i.e., $x4-x1 \geq 0.15$ where x4 and x1 are molar fractions of Al of the p-type intermediate barrier layer 5 and light emitting layer 6, respectively, as described above), most of holes and electrons combine in the light emitting layer 6, resulting in higher light efficiency of the LED 100.

When a molar fraction of Al is 0.5 or more, the intermediate barrier layer 5 made of InGaAlP based semiconductor becomes an indirect transition type semiconductor layer. Therefore, almost no radiative recombination 30 takes place in the intermediate barrier layer 5, thereby further increasing the efficiency of the radiative recombination in the light emitting layer 6. In the LED 100, a molar fraction x4 of Al of the intermediate barrier layer 5 is set to 0.5, whereby the intermediate barrier layer 5 becomes an indirect transition type semiconductor layer. This makes it difficult for the intermediate barrier layer 5 to emit light, whereby substantially all injected holes and electrons radiatively combine in the light emitting layer 6.

Figure 13:
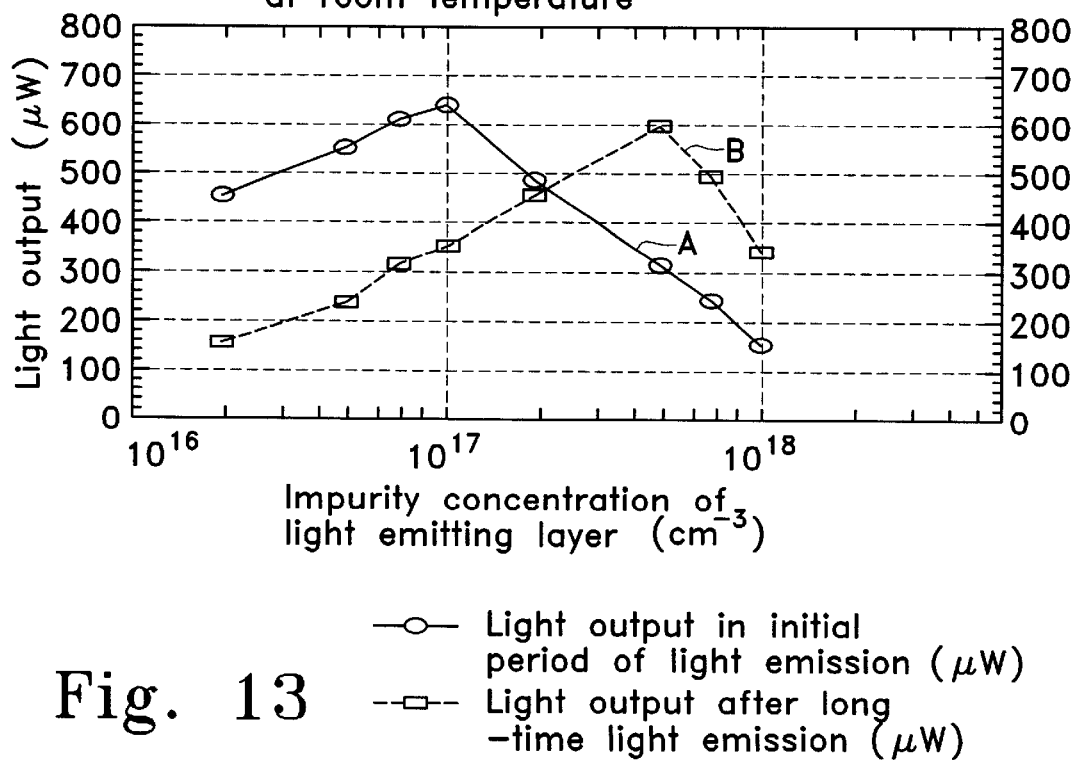
FIG. 13 is graph illustrating relationships between an impurity concentration of a light emitting layer, and a light output immediately after starting light emission and a light output after long-time light emission of the conventional LED shown in FIG. 12.

A number of LEDs according to Example 1 were manufactured, and then subjected to a long-time operation under the conditions such that a driving current of 50 mA was applied to the LEDs for 1000 hours at room temperature, like the operation in FIG. 13. Light outputs of the LEDs were measured after the 1000 hours. As a result, the average light output was 650 µW and a rate of change of the light output was within ±2% compared with the light output in an initial period of light emission where a driving current is 20 mA. The rate of change of the light output is sufficiently small for practical use.

EXAMPLE 2

Figure 3:
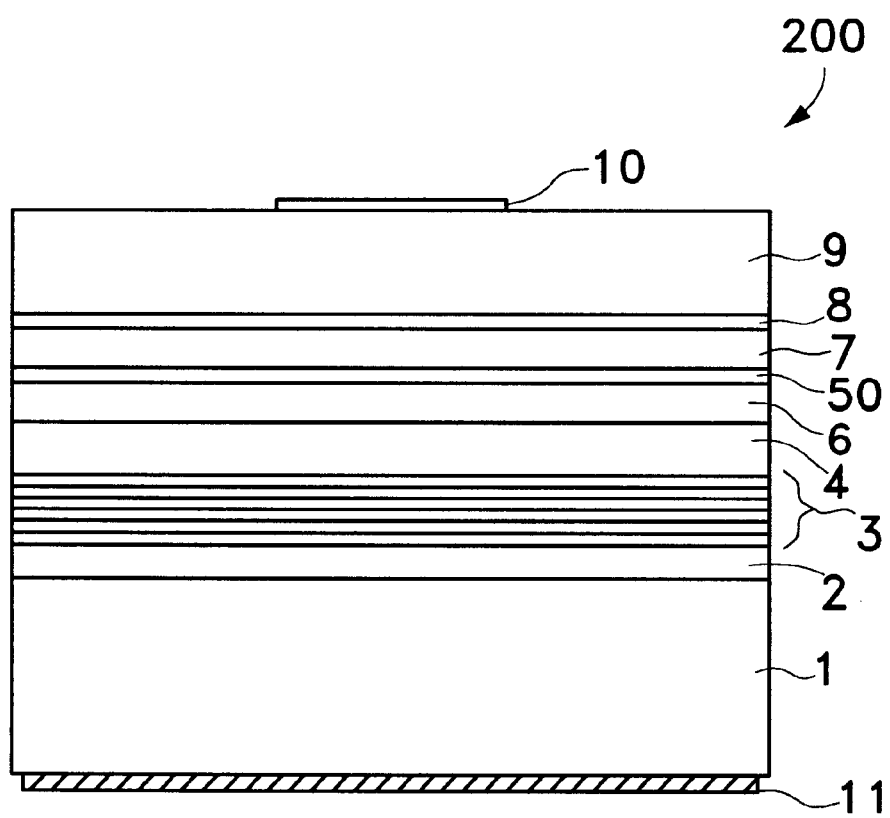
FIG. 3 is a cross-sectional view illustrating an LED according to Example 2 of the present invention.

FIG. 3 is a cross-sectional view illustrating an LED 200 according to Example 2 of the present invention. For the sake of simplicity, components having the same functions as those of the LED 100 of Example 1 are indicated by the same reference numerals as those used therein.

The LED 200 of Example 2 differs from the LED 100 of Example 1 in that a light emitting layer 6 is not doped with impurity, and therefore is of an n-type, and an intermediate barrier layer 50 is provided between the n-type light emitting layer 6 and a p-type second cladding layer 7. The energy gap of the intermediate barrier layer 50 is greater than that of the light emitting layer 6, but lower than that of the second cladding layer 7. The n-type intermediate barrier layer 50 is:

made of $(Ga_{0.5}Al_{0.5})_{0.5}In_{0.5}P$, doped with Si at an impurity concentration of $1 \times 10^{16}$ cm$^{-3}$, 0.2 µm thick.

Figure 4:
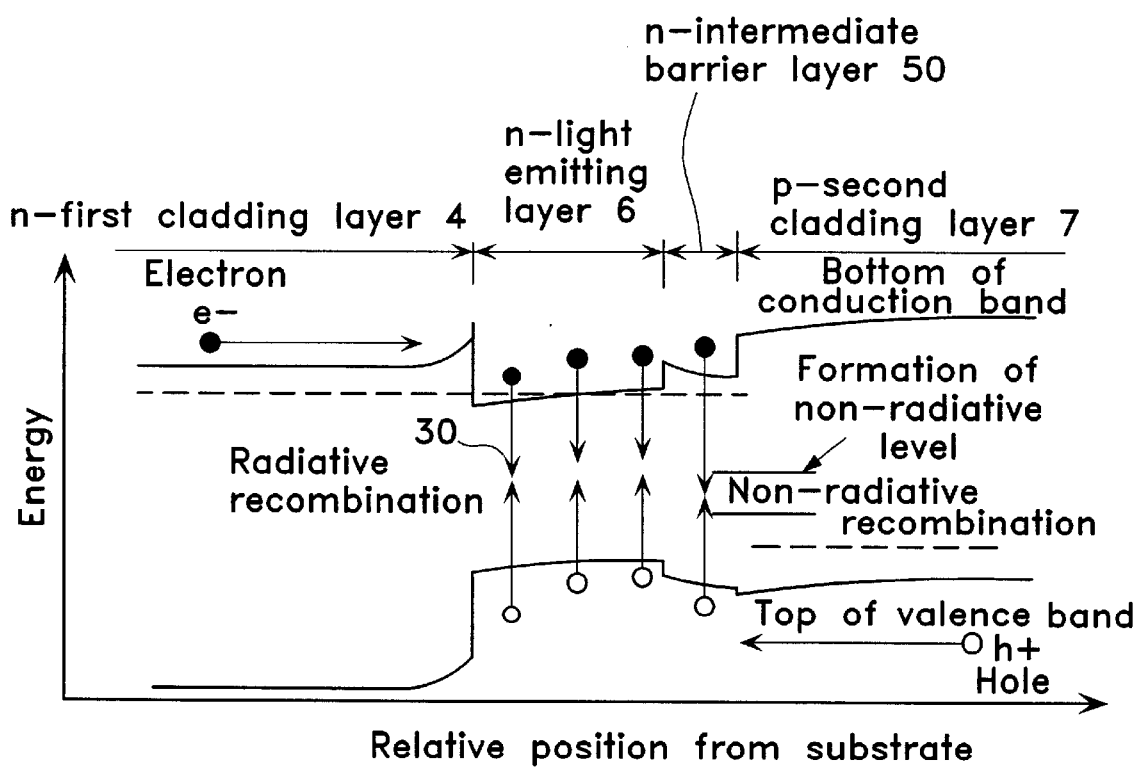
FIG. 4 is a diagram illustrating a state of energy bands in the vicinity of a light emitting layer of the LED of Example 2 after long-time light emission.

FIG. 4 illustrates a band state of the LED 200 after long-time light emission.

In the case where the LED 200 is made of InGaAlP based material which has lattice match with a GaAs substrate 1, when the light emitting layer 6 is not doped with impurity, the light emitting layer 6 becomes an n-type conductivity type. Example 2 will be described in the case where the light emitting layer 6 is of an n-type.

In the LED 200, the n-type intermediate barrier layer 50 is provided between the n-type light emitting layer 6 and the p-type second cladding layer 7. The intermediate barrier layer 50 is doped with Si. The impurity concentration is preferably $1 \times 10^{17}$ cm$^{-3}$ or less. A thickness of the intermediate barrier layer 50 is less than a diffusion length of a hole as a minority carrier. The diffusion length of a hole is less than that of an electron, i.e., about 0.3 µm. Accordingly, a thickness of the intermediate barrier layer 50 is 0.2 µm in the LED 200 of Example 2. This value is greater than 0.1 µm, which is the thickness value that prevents influence of a crystal defect caused by a pn junction between the intermediate barrier layer 50 and the p-type second cladding layer 7 from reaching the light emitting layer 6. Therefore, a decrease in a light output after long-time light emission is sufficiently small for practical use, like the LED 100 of Example 1.

It is well known that long-time light emission leads to diffusion of Zn which is a p-type impurity. As Zn diffuses in the light emitting layer 6, the light emission efficiency of the light emitting layer 6 is decreased. Particularly for a high-output LED, the current diffusion layer 9 and the p-type second cladding layer 7 are doped with a large amount of Zn in order to decrease the resistivity thereof. In this case, the Zn diffusion to the light emitting layer 6 is significant, resulting in a decrease in the light emission efficiency.

In the LED 200 of Example 2, however, the intermediate barrier layer 50 having a low impurity concentration is provided between the p-type second cladding layer 7 and the light emitting layer 6, whereby diffusion of Zn to the light emitting layer 6 is prevented and therefore a decrease in the light emission efficiency is prevented. In particular, since the intermediate barrier layer 50 has a low molar fraction of Al, the diffusion of Zn is subsequently low. Therefore, the intermediate barrier layer 50 is effective to prevention of Zn diffusion. As a result, the LED 200 can have light emission efficiency which is not decreased after long-time light emission even when an impurity concentration of the current diffusion layer 9 is increased so as to decrease an operational voltage.

In the LED 200 of Example 2, a light output is substantially not decreased since there is substantially no diffusion of Zn from the p-type current diffusion layer 9 and the p-type second cladding layer 7. For example, after long-time operation under such conditions that a driving current of 50 mA is applied to the LEDs for 1000 hours at room temperature like the operation in FIG. 2, a light output of the LED 200 is within ±2% from 450 µW obtained in an initial period of light emission where a driving current is 20 mA. Note that the driving voltage is decreased by 10% compared with that of Example 1.

EXAMPLE 3

Figure 5:
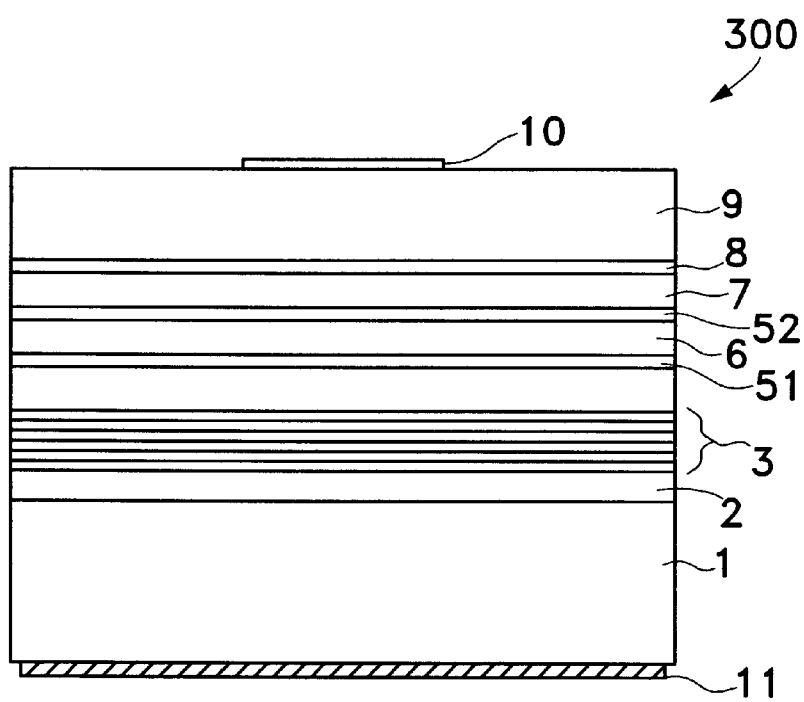
FIG. 5 is a cross-sectional view illustrating an LED according to Example 3 of the present invention.

FIG. 5 is a cross-sectional view illustrating an LED 300 according to Example 3 of the present invention. For the sake of simplicity, components having the same functions as those of the LED 100 of Example 1 are indicated by the same reference numerals as those used therein.

The LED 300 of Example 3 differs from the LED 100 of Example 1 in that in addition to a p-type first intermediate barrier layer 51 (indicated by reference numeral 5 in Example 1) provided between an n-type first cladding layer 4 and a p-type light emitting layer 6, a p-type second intermediate barrier layer 52 is provided between the n-type light emitting layer 6 and a p-type second cladding layer 7. The p-type intermediate barrier layer 52 is:

made of $(Ga_{0.5}Al_{0.5})_{0.51}In_{0.49}P$, doped with Zn at an impurity concentration of $1 \times 10^{17}$ cm$^{-3}$, 0.2 µm thick.

Figure 6:
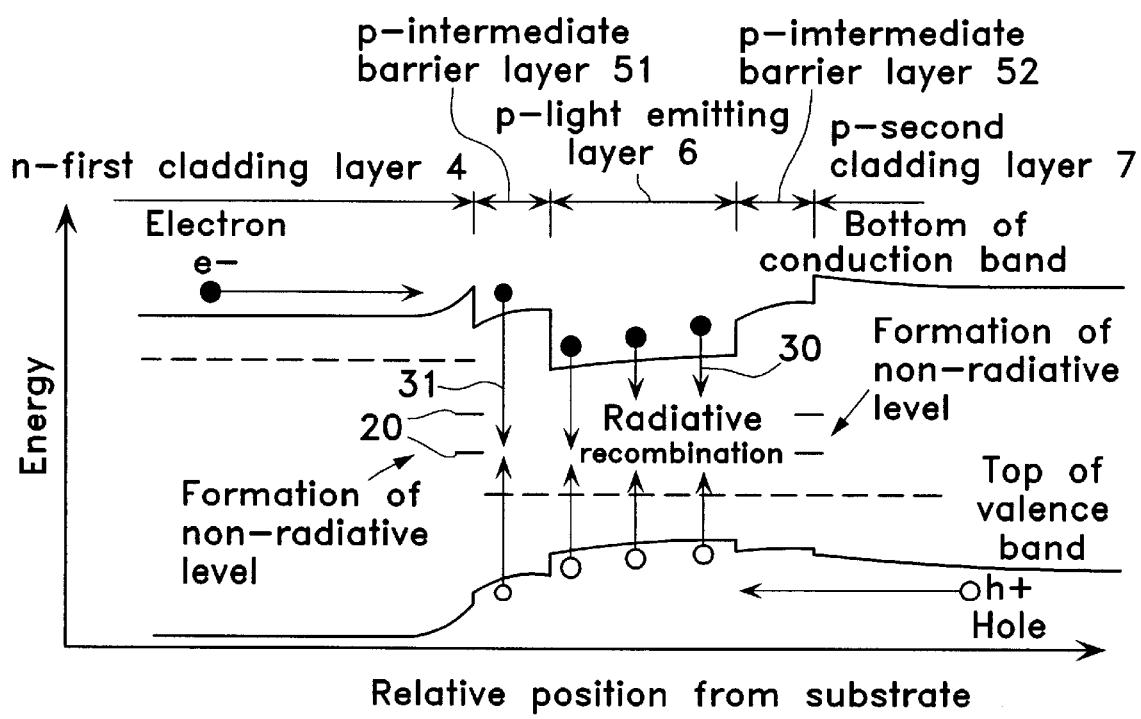
FIG. 6 is a diagram illustrating a state of energy bands in the vicinity of a light emitting layer of the LED of Example 3 after long-time light emission.

FIG. 6 illustrates band states of the LED 300 in an initial period of light emission and after long-time light emission, respectively.

In addition to a configuration of the LED 100 of Example 1, the p-type second intermediate barrier layer 52 is provided between the p-type light emitting layer 6 and the p-type second cladding layer 7 which do not form a pn junction interface. The p-type second intermediate barrier layer 52 prevents generation of a crystal defect due to an energy gap between the light emitting layer 6 and the second cladding layer 7 as described in Example 2. The prevention of the reduction in the light output is more effective than that of the LED 100 of Example 1.

Furthermore, the p-type second intermediate barrier layer 52 has a low impurity concentration and a low molar fraction of Al. Therefore, the p-type second intermediate barrier layer 52 prevents diffusion of Zn from the p-type current diffusion layer 9 and the p-type second cladding layer 7 into the light emitting layer 6, thereby preventing a decrease in light emission efficiency.

As a result, the LED 300 of Example 3 prevents a decrease in light emission efficiency of the light emitting layer 6 over a longer time period of light emission than the LED 100 of Example 1.

Moreover, as compared with the LED 100 of Example 1, the LED 300 of Example 3 has a low level of crystal defect generation and thus a higher light output. Specifically, a light output of the LED 300 was measured after 1000-hour operation where a driving current of 50 mA was applied to the LED 300 at room temperature. This condition is similar to that used in the operation of FIG. 13. As a result, a light output of the LED 300 was 720 μW. This value was within ±2% from a light output obtained in an initial period of light emission where a driving current is 20 mA.

EXAMPLE 4

Figure 7:
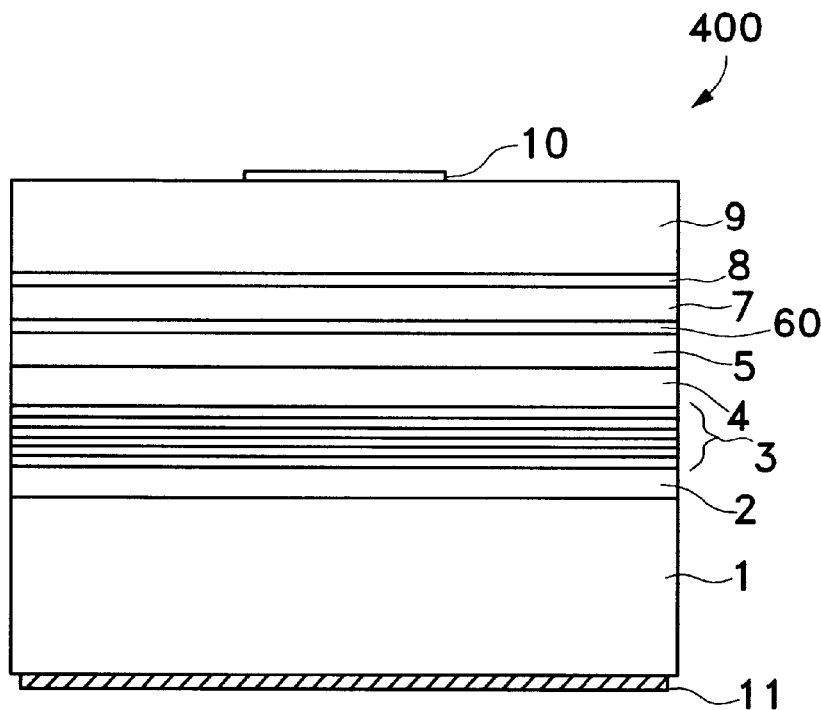
FIG. 7 is a cross-sectional view illustrating an LED according to Example 4 of the present invention.

FIG. 7 is a cross-sectional view illustrating an LED 400 according to Example 4 of the present invention. For the sake of simplicity, components having the same functions as those of the LED 100 of Example 1 are indicated by the same reference numerals as those used therein.

The LED 400 of Example 4 differs from the LED 100 of Example 1 in that a light emitting layer 60 has multi-quantum well (MQW) structure and an intermediate barrier layer 5 is provided between the light emitting layer 60 and the n-type first cladding layer 4. The light emitting layer 60 is composed by alternation of $Ga_{0.51}In_{0.49}P$ layers and $(Ga_{0.5}Al_{0.5})_{0.5}In_{0.5}P$ layers which have a thickness loss than the de Broglie wavelength. An energy gap of the intermediate barrier layer 5 has a value between those of the light emitting layer 60 and n-type first cladding layer 4. The intermediate barrier layer 5 is provided with a thin thickness, i.e., 0.05 μm.

With the MQW structure, generation of a crystal defect in the light emitting layer 60 is hindered. Therefore, any crystal defect generated in a pn junction between the n-type first cladding layer 4 and the intermediate barrier layer 5 hardly continues to spread its growth into the light emitting layer 60. It is possible to prevent reduction of a light output when a thickness of the intermediate barrier layer 5 is of a value up to 0.02 μm.

EXAMPLE 5

Figure 8:
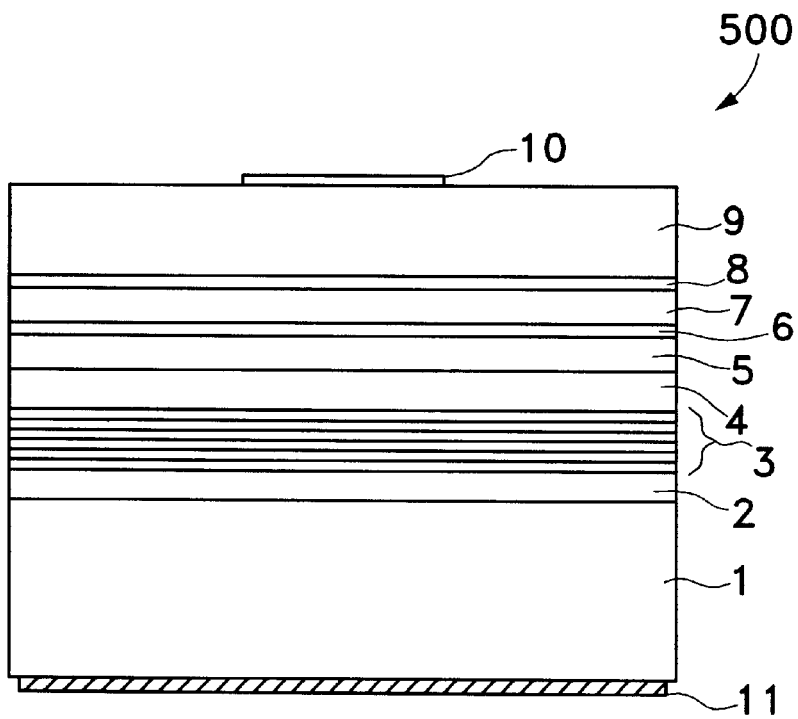
FIG. 8 is a cross-sectional view illustrating an LED according to Example 5 of the present invention.

FIG. 8 is a cross-sectional view illustrating an LED 500 according to Example 5 of the present invention. For the sake of simplicity, components having the same functions as those of the LED 100 of Example 1 are indicated by the same reference numerals as those used therein.

Each of the LEDs of the foregoing Examples has an n-type substrate. In Example 5, the LED 500 has a p-type substrate. In this case, the same effects as those of the LEDs of the foregoing Examples are also obtained.

The LED 500 of Example 5 includes:

a substrate 1: made of p-type GaAs;

a first buffer layer 2: made of p-type GaAs;

a light reflection (DBR) layer 3: including p-type $(Al_{0.4}Ga_{0.6})_{0.5}In_{0.5}P$ layers and p-type $Al_{0.5}In_{0.5}P$ layers deposited in an alternatively fashion;

a first cladding layer 4: made of p-type $Al_{0.5}In_{0.5}P$, doped with Zn at an impurity concentration of $5 \times 10^{17}$ cm$^{-3}$, 1 μm thick;

an intermediate barrier layer 5: made of n-type $(Ga_{0.5}Al_{0.5})_{0.5}In_{0.5}P$, doped with Si at an impurity concentration of $5 \times 10^{17}$ cm$^{-3}$, 0.1 μm thick;

a light emitting layer 6: made of n-type $(Ga_{0.7}Al_{0.3})_{0.5}In_{0.5}P$, 0.5 μm thick;

a second cladding layer 7: made of n-type $Al_{0.5}In_{0.5}P$, doped with Si at an impurity concentration of $5 \times 10^{17}$ cm$^{-3}$, 1 μm thick;

a second buffer layer 8: made of n-type $(Al_{0.05}Ga_{0.95})_{0.95}In_{0.05}P$, doped with Si at an impurity concentration of $1 \times 10^{18}$ cm$^{-3}$1, 0.15 μm thick; and a current diffusion layer 9: made of n-type $(Al_{0.1}Ga_{0.99})_{0.99}In_{0.01}P$, doped with Si at an impurity concentration of $1 \times 10^{18}$ cm$^{-3}$, 7 μm thick.

Since a p-type substrate is more difficult to manufacture than an n-type substrate, the n-type substrate is used for most LEDs. Since the LED 500 includes the p-type substrate, the current diffusion layer 9 is of an n-type. The n-type current diffusion layer 9 can have the same current diffusion effect as that of a p-type current diffusion layer even when the impurity concentration is lower than that of the p-type current diffusion layer. This leads, advantageously, to a decrease in diffused impurity to the light emitting layer 6 and thus to substantial prevention of a reduction in light emission efficiency. Further, the contact resistance between the n-type current diffusion layer 9 and an n-side electrode can be lowered.

In all the foregoing descriptions, each of the LEDs is made of InGaAlP based semiconductor which has lattice match with a GaAs substrate. As is obvious from the above descriptions, the LEDs of the present invention may be made of other materials such as III–V compound semiconductor (e.g., AlGaAs, AlGaInSb, InGaAsP, AlGaInN, and GaInNSb) and II–VI compound semiconductor. Thickness and carrier concentration of layers made of these materials may be also modified in the LEDs of the present invention.

EXAMPLE 6

Figure 9:
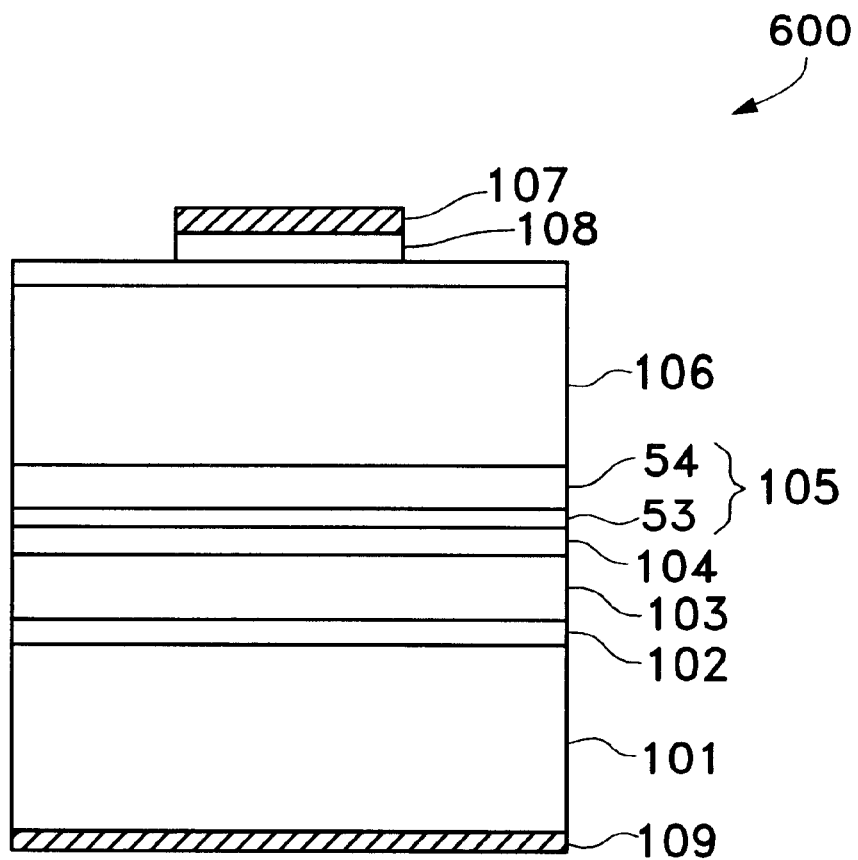
FIG. 9 is a cross-sectional view illustrating an LED according to Example 6 of the present invention.
Figure 15:
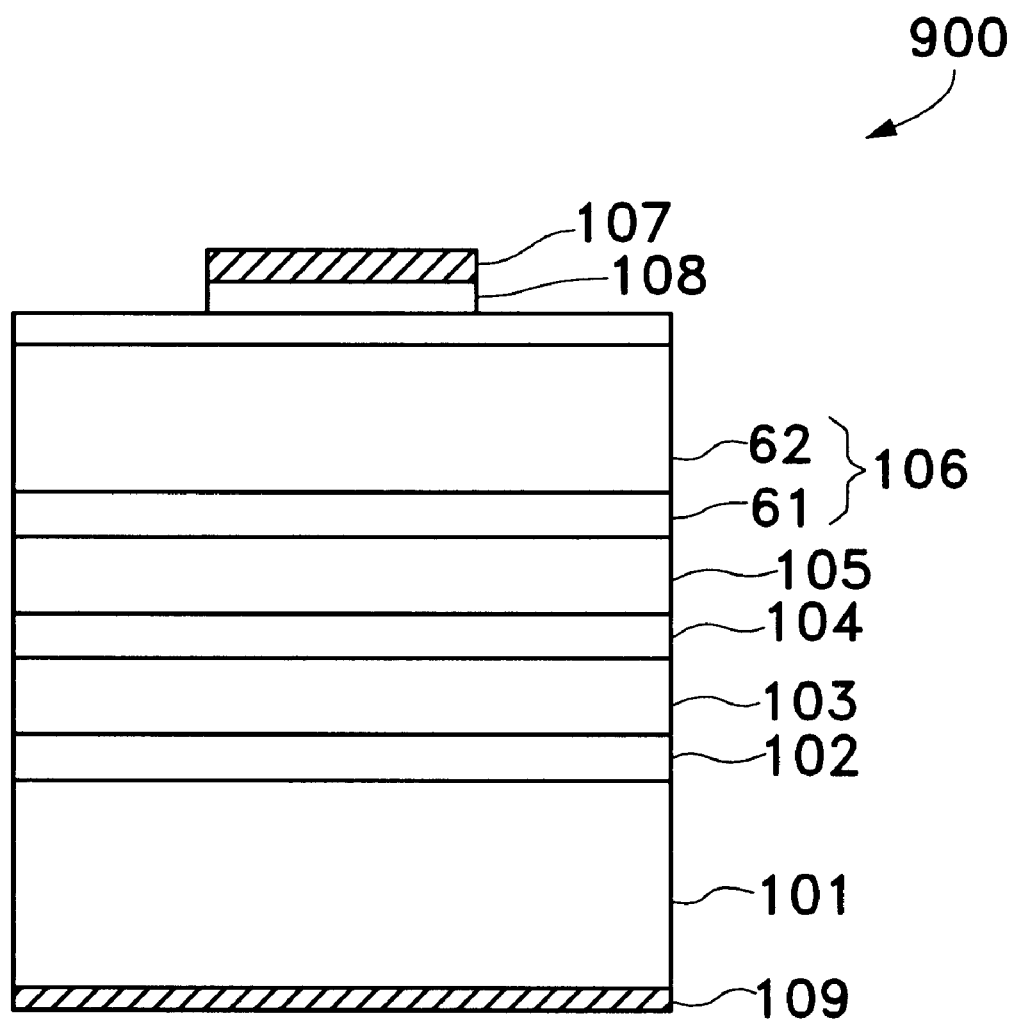
FIG. 15 is a cross-sectional view illustrating another conventional LED.

FIG. 9 is a cross-sectional view illustrating an LED 600 according to Example 6 of the present invention. For the sake of simplicity, components having the same functions as those of the conventional LED 900 shown in FIG. 15 are indicated by the same reference numerals as those used therein.

The LED 600 of Example 6 differs from the conventional LED 900 in that a p-type second cladding layer 105 is composed of a p-type second intermediate barrier layer 53 and a p-type second cladding layer 54. The n-type second intermediate barrier layer 53 has a molar fraction of Al greater than that of a light emitting layer 104 and less than that of the p-type second cladding layer 105 of the LED 900 and is provided at the lower portion of the p-type second cladding layer 105. The p-type second cladding layer 54 has a sufficient molar fraction of Al to confine carriers and is provided at the upper portion of the p-type second cladding layer 105.

The LED 600 of Example 6 is provided with:

the p-type second intermediate barrier layer 53: made of p-type $(Ga_{0.5}Al_{0.5})_{0.5}In_{0.5}P$ (a molar fraction of Al is 0.5), doped with Zn at an impurity concentration of $2 \times 10^{17}$ cm$^{-3}$, 0.3 μm thick;

the p-type second cladding layer 54: made of p-type $Al_{0.5}In_{0.5}P$ (a molar fraction of Al is 1.0), doped with Zn at an impurity concentration of $5 \times 10^{17}$ cm$^{-3}$, 1.0 μm thick; and a current diffusion layer 106: a mono layer.

In the above-described structure, the p-type second cladding layer 54 has a sufficient molar fraction of Al to confine carriers, thereby making it possible to obtain a high light output of the LED 600. A molar fraction x of Al of the p-type second cladding layer 54 is preferably in the range of $0.7 \leq x \leq 1$. The p-type second intermediate barrier layer 53 has a low impurity concentration and a low molar fraction of Al. This leads to prevention of impurity diffusion due to light emission, thereby preventing a decrease in a light output after long-time light emission.

Note that in the p-type second intermediate barrier layer 53, the low molar fraction of Al as well as the low impurity concentration are responsible for improvement of crystallinity and thus prevention of impurity diffusion. The high oxidation of Al causes oxygen included in a material of a layer to be brought into the crystal. Therefore, a high molar fraction of Al makes the structure of the crystal imperfect compared with an ideal structure of the crystal. A crystal having such imperfect structure often has a vacant lattice point, which is a lattice point of an ideal crystal where an atom is expected to be positioned, but does not contain an atom; and also has a void greater than what is expected in an ideal crystal. This facilitates diffusion of impurity as compared with the diffusion in an ideal crystal.

Preferably, a molar fraction x of Al of the p-type second cladding layer 54 is as great as possible in order to confine carriers satisfactorily. Generally, x is equal to 1.0. Also, the resistivity of the p-type second cladding layer 54 is preferably as low as possible in order to diffuse carriers in the entire light emitting layer 104. To this end, an impurity concentration of the p-type second cladding layer 54 is preferably as high as possible.

In the p-type second intermediate barrier layer 53, a molar fraction of Al should be set to a low value, e.g., 0.5. This improves crystallinity, thereby making it possible to prevent impurity diffusion in spite of a low thickness of the p-type second intermediate barrier layer 53.

When a thickness of the p-type second intermediate barrier layer 53 is great, carriers overflowing from the light emitting layer 104 emit light in the p-type second intermediate barrier layer 53 or are eliminated by combining nonradiatively, thereby reducing light emission efficiency of the light emitting layer 104. To prevent this phenomenon, a thickness of the p-type second intermediate barrier layer 53 is preferably one half of a diffusion length of an electron which is a minority carrier in the p-type second intermediate barrier layer 53. InGaAlP crystal having a molar fraction of Al of 0.5 normally has an electron diffusion length of about 0.5 $\mu$m. Accordingly, a thickness of the p-type second intermediate barrier layer 53 is preferably 0.3 $\mu$m or less.

Note that an impurity concentration as well as a thickness of the p-type second intermediate barrier layer 53 are more preferably optimized.

Figure 10A:
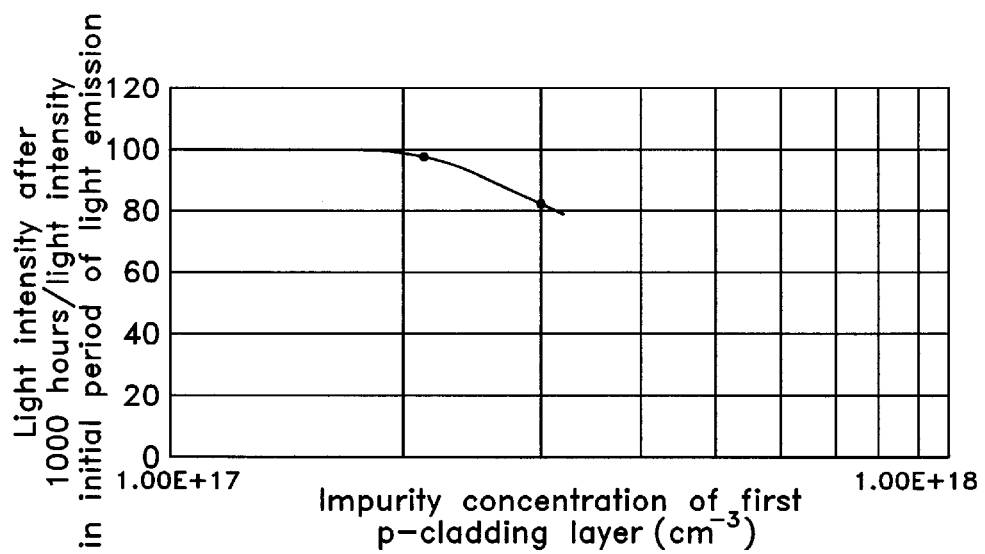
FIGS. 10A and 10B are graphs illustrating relationships between a reduction rate of a light output after long-time light emission, and an impurity concentration and a thickness a p-type second intermediate barrier layer of the LED according to Example 6, respectively.
Figure 10B:
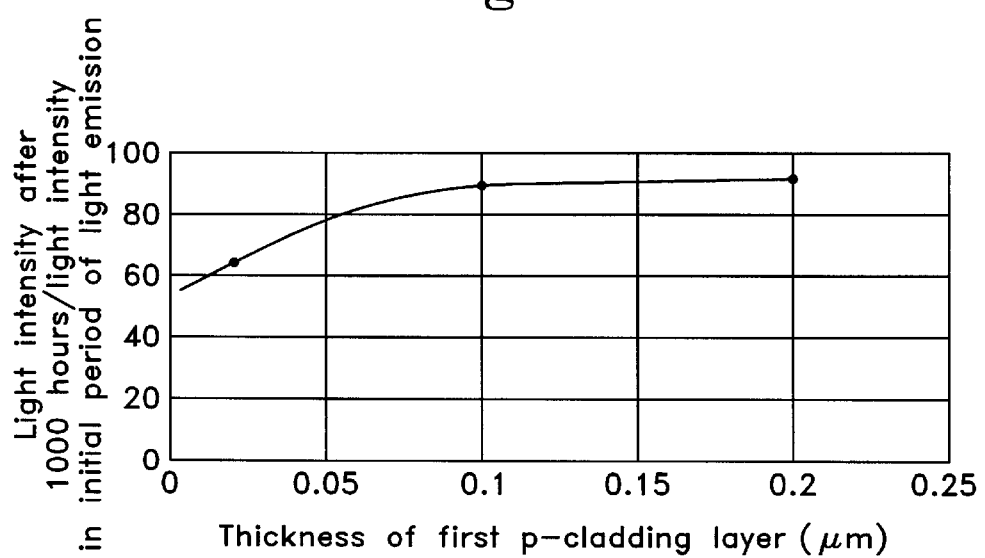

FIG. 10A illustrates a relationship between an impurity concentration, and a ratio of a light output after 1000-hour light emission to a light output in an initial period of light emission for the p-type second intermediate barrier layer 53. FIG. 10B illustrates a relationship between a thickness, and a ratio of a light output after 1000-hour light emission to a light output in an initial period of light emission for the p-type second intermediate barrier layer 53. The light emission was performed under such conditions that a driving current of 50 mA was applied to the p-type second intermediate barrier layer 53 at room temperature.

When an impurity concentration of the p-type second intermediate barrier layer 53 is high, light emission efficiency is decreased. This may be because impurities diffused from a current diffusion layer 106 and the p-type second cladding layer 54 depose impurities in p-type second intermediate barrier layer 53 to the light emitting layer 104.

On the other hand, when a thickness of the p-type second intermediate barrier layer 53 is too low, some of the impurities diffuse into the light emitting layer 104, causing a decrease in a light output.

As can be seen from FIG. 10A, the p-type second intermediate barrier layer 53 having a sufficiently low impurity concentration of $3\times10^{17}$ cm$^{-3}$ or less prevents the p-type impurities diffused from the current diffusion layer 106 and the p-type second cladding layer 54 from further diffusing into the light emitting layer 104. In this case, a light output after 1000-hour light emission is 80% or more of a light output in an initial period of light emission, which is a level of light intensity sufficient for practical use.

FIG. 10B shows a result where an impurity concentration of the light emitting layer 104 is $1\times10^{17}$ cm$^{-3}$. As can be seen from FIG. 10B, the p-type second intermediate barrier layer 53 having a thickness of 0.1 $\mu$m or more enables realization of an LED which has a light output after 1000-hour light emission that is 90% or more of a light output in an initial period of light emission. Such an LED is practically useful.

When the p-type second intermediate barrier layer 53 has a great thickness, the p-type second cladding layer 54 loses a carrier confinement effect. Such a p-type second intermediate barrier layer 53 serves as a p-type cladding layer having an original function. In this case, carriers are consumed by radiative recombination and the like in the p-type second intermediate barrier layer 53. Therefore, a thickness of the p-type second intermediate barrier layer 53 is required to be equal to or less than a diffusion length of an electron which is a minority carrier of a p-type layer. A diffusion length of an electron is 0.5–1.5 $\mu$m in AlGaInP based compound semiconductor which has lattice match with GaAs. When a molar fraction of Al is 0.5 in the AlGaInP based compound semiconductor, a diffusion length of an electron is about 0.5 $\mu$m. Therefore, a thickness of the p-type second intermediate barrier layer 53 is required to be 0.5 $\mu$m or less, more preferably 0.3 $\mu$m or less.

EXAMPLE 7

Figure 11:
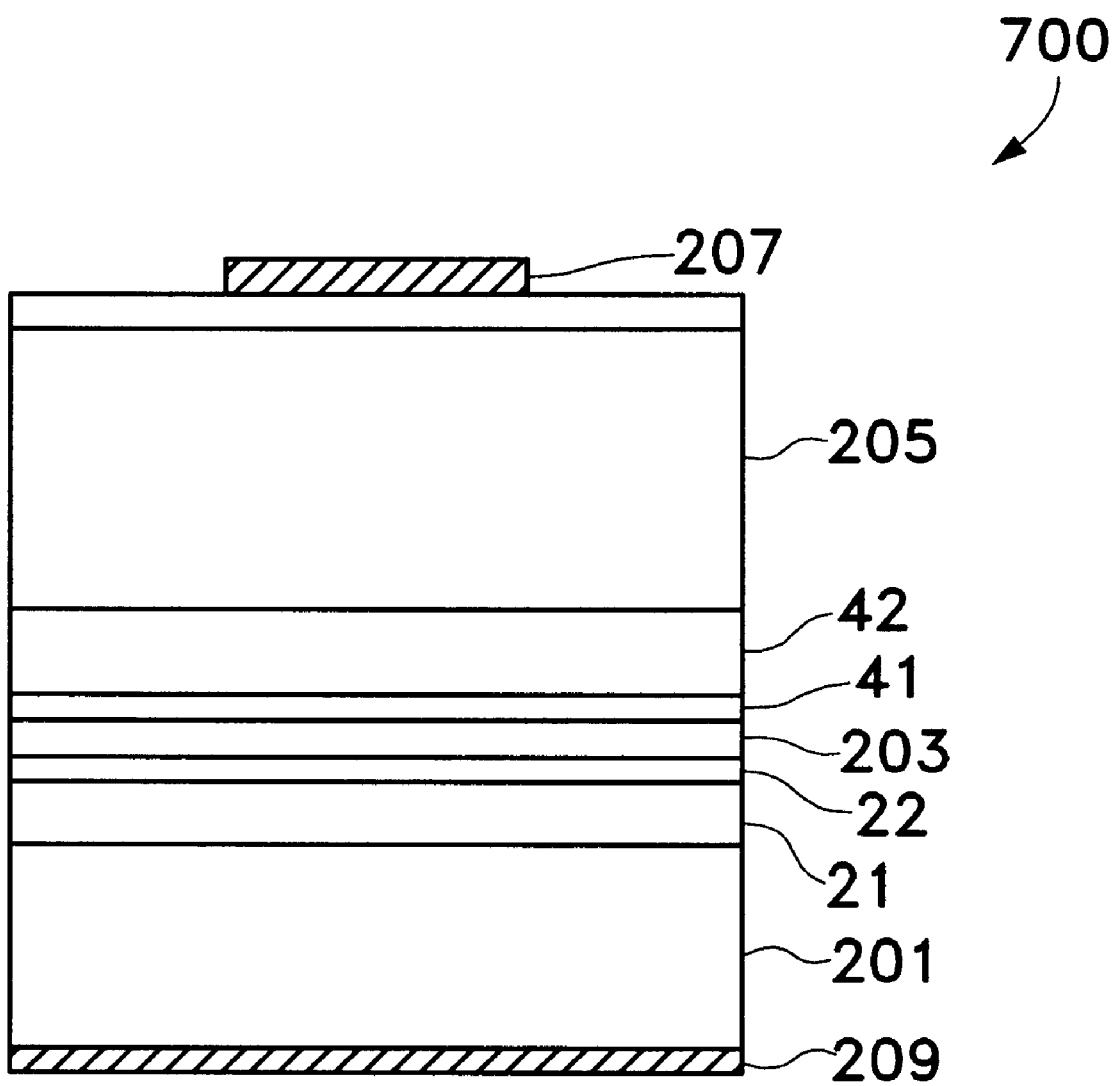
FIG. 11 is a cross-sectional view illustrating an LED according to Example 7 of the present invention.

FIG. 11 is a cross-sectional view illustrating an LED according to Example 7 of the present invention. On an n-type GaAs substrate 201, an n-type $(Al_xGa_{1-x})_yIn_{1-y}P$ first cladding layer 21 (x=1.0, y=0.5, an Si carrier concentration of $5\times10^{17}$ cm$^{-3}$, 1 $\mu$m thick); an n-type $(Al_xGa_{1-x})_yIn_{1-y}P$ first intermediate barrier layer 22 (x=0.5, y=0.5, an Si carrier concentration of $2\times10^{17}$ cm$^{-3}$, 0.5 $\mu$m thick); a $(Al_xGa_{1-x})_yIn_{1-y}P$ light emitting layer 203 (x=0.3, y=0.5, 0.5 $\mu$m thick); a p-type $(Al_xGa_{1-x})_yIn_{1-y}P$ second intermediate barrier layer 41 (x=0.5, y=0.5, a Zn carrier concentration of $2\times10^{17}$ cm$^{-3}$, 0.5 $\mu$m thick); a p-type $(Al_xGa_{1-x})_yIn_{1-y}P$ second cladding layer 42 (x=1.0, y=0.5, a Zn carrier concentration of $5\times10^{17}$ cm$^{-3}$, 1 $\mu$m thick); and a $(Al_xGa_{1-x})_yIn_{1-y}P$ current diffusion layer 205 (x=0.05, y=0.90, a Zn carrier concentration of $1\times10^{18}$ cm$^{-3}$, 7 $\mu$m thick), are successively deposited. Further, a p-side electrode 207 is formed on an upper surface of the current diffusion layer 205. An n-side electrode 209 is formed on a lower surface of the substrate 201. Subsequently, a light emitting diode 700 is completely fabricated.

The p-type second intermediate barrier layer 41 has a low molar fraction of Al and a low impurity concentration and further has a great thickness of 0.5 $\mu$m. Therefore, the p-type second intermediate barrier layer 41 prevents diffusion of impurities from the current diffusion layer 205 and the p-type second cladding layer 42 into the light emitting layer 203, thereby preventing reduction of light emission efficiency. With the n-type first intermediate barrier layer 22, the light emitting layer 203 having a low molar fraction of Al can be formed thereon. The low molar fraction of Al leads to satisfactory crystallinity in the light emitting layer 203. The pn junction between the light emitting layer 203 having such satisfactory crystallinity and the n-type first intermediate barrier layer 22 can improve light emission efficiency.

In all the foregoing descriptions, each of the LEDs is made of InGaAlP based semiconductor which has lattice match with a GaAs substrate. As is obvious from the above descriptions, the LEDs of the present invention may be made of other materials such as III–V compound semiconductor (e.g., AlGaAs, AlGaInSb, InGaAsP, and AlGaInN) in which an energy gap can be set by a molar fraction of Al. Thickness and carrier concentration of layers made of these materials may also be modified in the LEDs of the present invention.

As described above, in the LED of the present invention, a light output is less decreased even after long-time light emission.

According to one aspect of the present invention, a crystal defect generated at a pn junction is prevented from affecting a light emitting layer, thereby realizing the LED in which a reduction in a light output is prevented even after long-time light emission.

According to another aspect of the present invention, a crystal defect generated at a pn junction is prevented from affecting a light emitting layer so that a reduction in light emission efficiency is prevented, thereby realizing the LED in which a reduction in a light output is prevented even after long-time light emission.

According to still another aspect of the present invention, non-radiative recombination in the intermediate barrier layer is substantially eliminated, thereby realizing the LED having a high level of light emission efficiency.

According to still another aspect of the present invention, a p-type impurity which tends to be easily diffused is prevented from diffusing into the light emitting layer, thereby preventing a reduction in light emission efficiency.

According to still another aspect of the present invention, a light output is less decreased in a spectrum from red light to green light even after long-time light emission.

According to still another aspect of the present invention, even when the LED is a high-intensity LED which includes a cladding layer having a high molar fraction of Al, a p-type impurity which tends to be easily diffused is prevented from diffusing from the current diffusion layer or the p-type second cladding layer into the light emitting layer even after long-time light emission, thereby preventing a reduction in a light output.

According to still another aspect of the present invention, a molar fraction of Al of the p-type second intermediate barrier layer is 0.5 or less, and a molar fraction of Al of the p-type second cladding layer is 0.7 or more, thereby satisfactorily maintaining the crystallinity of the p-type second intermediate barrier layer and therefore making it possible to prevent diffusion of an impurity.

According to still another aspect of the present invention, even when the LED includes the p-type second intermediate barrier layer, the p-type second cladding layer maintains a carrier confinement effect, thereby realizing a high light output and making it possible to maintain a characteristic of the LED at high temperature. Further, the p-type second cladding layer has a low impurity concentration and therefore absorbs incoming impurities to prevent them from diffusing into the light emitting layer.

According to still another aspect of the present invention, even when the LED emits light in a spectrum from red light to green light at high intensity for a long time, a p-type impurity which tends to be easily diffused is prevented from diffusing from the current diffusion layer or the p-type second cladding layer into the light emitting layer, thereby preventing a reduction in a light output.

Various other modifications will be apparent to and can be readily made by those stilled in the art without departing from the scope and spirit of this invention. Accordingly, it is not intended that the scope of the claims appended hereto be limited to the description as set forth herein, but rather that the claims be broadly construed.

What is claimed is:

1. A light emitting diode, comprising:
    a substrate;
    a light emitting layer;
    a first cladding layer having a first conductivity type and an energy gap greater than an energy gap of the light emitting layer;
    a second cladding layer having a second conductivity type and an energy gap greater than an energy gap of the light emitting layer; and
    an intermediate barrier layer having the same conductivity type as the conductivity type of the light emitting layer but different from the conductivity type of the first or second cladding layer, and having an energy gap less than the energy gap of the first or second cladding layer but greater than the energy gap of the light emitting layer,
    wherein the light emitting diode has a double heterostructure such that the light emitting layer is interposed between the first and second cladding layer; and the intermediate barrier layer is disposed between the light emitting layer and the first cladding layer and/or between the light emitting layer and the second cladding layer.

2. A light emitting diode according to claim 1, wherein a thickness of the intermediate barrier layer is less than a diffusion length of a minority carrier in the intermediate barrier layer and is greater than a value such that a non-radiative recombination center generated at an interface between the intermediate barrier layer and the first or second cladding layer has substantially no influence on the light emitting layer.

3. A light emitting diode according to claim 1, wherein a thickness of the intermediate barrier layer is in the range of 0.1 $\mu$m or more and 0.5 $\mu$m or less.

4. A light emitting diode according to claim 1, wherein the energy gap of the intermediate barrier layer is greater by 0.2 eV or more than the energy gap of the light emitting layer.

5. A light emitting diode according to claim 1, wherein the intermediate barrier layer is an indirect transition type semiconductor layer having a long non-radiative recombination lifetime.

6. A light emitting diode according to claim 1, wherein the intermediate barrier layer comprises first and second intermediate barrier layers; the first intermediate barrier layer is provided between the light emitting layer and the first cladding layer; the second intermediate barrier layer is provided between the light emitting layer and the second cladding layer; the first intermediate barrier layer having the same conductivity type as the conductivity type of the light emitting layer but different from the conductivity type of the first cladding layer adjacent to the first intermediate barrier layer, and having an energy gap less than the energy gap of the first cladding layer but greater than an energy gap of the light emitting layer; and the second intermediate barrier layer having the same conductivity type as the conductivity type of the light emitting layer and the conductivity type of the second cladding layer adjacent to the second intermediate barrier layer, and having an energy gap less than the energy gap of the second cladding layer but greater than the energy gap of the light emitting layer.

7. A light emitting diode according to claim 1, wherein the substrate is made of GaAs;
    the first cladding layer is made of $(Ga_{1-x2}Al_{x2})_{0.5}In_{0.5}P$ (x1<x2≦1);

the light emitting layer is made of a $(Ga_{1-x1}Al_{x1})_{0.5}In_{0.5}P$ ($0 \leq x1 < 1$);

the intermediate barrier layer is made of $(Ga_{1-x4}Al_{x4})_{0.5}In_{0.5}P$ ($x1 < x4 < x2, x3$); and the second cladding layer is made of $(Ga_{1-x3}Al_{x3})_{0.5}In_{0.5}P$ ($x1 < x3 \leq 1$).

* * * * *